_US006127447A_

United States Patent [19]
Mitry et al.

[11] Patent Number: 6,127,447
[45] Date of Patent: Oct. 3, 2000

[54] PHOTOPOLYMERIZATION PROCESS AND COMPOSITION EMPLOYING A CHARGE TRANSFER COMPLEX AND CATIONIC PHOTOINITIATOR

[75] Inventors: Mark Mitry, Woodbury, Minn.; Roger McCartney, St. Louis, Mo.; Mohamed R. Amin, Gaithersburg, Md.

[73] Assignee: Fusion UV Systems, Inc., Gaithersburg, Md.

[21] Appl. No.: 09/363,896

[22] Filed: Jul. 30, 1999

Related U.S. Application Data

[60] Provisional application No. 60/094,742, Jul. 31, 1998.

[51] Int. Cl.$^7$ .................. C08F 2/46; C08F 2/48; C08F 216/12; C08F 222/06
[52] U.S. Cl. .................. 522/107; 522/104; 522/167; 522/168; 522/178; 522/180; 522/186; 522/913; 522/188; 427/517; 427/520; 430/58
[58] Field of Search .................. 522/104, 107, 522/167, 168, 173, 174, 178, 181, 184, 913, 186, 188; 430/58; 427/517, 520

[56] References Cited

U.S. PATENT DOCUMENTS

| | | |
|---|---|---|
| 3,721,722 | 3/1973 | Baum . |
| 4,058,400 | 11/1977 | Crivello . |
| 4,079,041 | 3/1978 | Baumann et al. . |
| 4,423,136 | 12/1983 | Crivello et al. . |
| 5,389,700 | 2/1995 | Sasaki et al. .............................. 522/47 |
| 5,446,073 | 8/1995 | Jonsson et al. . |
| 5,480,918 | 1/1996 | Sasaki ....................................... 522/64 |
| 5,514,522 | 5/1996 | Fitzgerald et al. ................... 430/284.1 |
| 5,536,760 | 7/1996 | Friedlander et al. . |
| 6,025,409 | 2/2000 | Jansen ..................................... 522/107 |

FOREIGN PATENT DOCUMENTS

| | | |
|---|---|---|
| 947701 | 1/1964 | United Kingdom . |
| WO 97/31981 | 9/1997 | WIPO . |
| WO 98/11151 | 3/1998 | WIPO . |
| WO 98/11152 | 3/1998 | WIPO . |

*Primary Examiner*—Rabon Sergent
*Assistant Examiner*—Sanza L. McClendon
*Attorney, Agent, or Firm*—Shlesinger Arkwright & Garvey LLP

[57] ABSTRACT

A radiation curable coating composition is provided and includes an effective amount of cationic photoinitiator, in combination with a charge transfer complex, the charge transfer complex comprising at least one electron withdrawing reactant component and at least one electron donating reactant component free radically reactive therewith, the electron withdrawing reactant component comprising an unsaturated nitrogen containing compound and the electron donating reactant component comprising an unsaturated compound having at least one vinyl ether group, the electron donating reactant component may be separate from or structurally incorporated within the electron withdrawing reactant component and an effective amount of a cationic photoinitiator. A photopolymerization process employing the composition is also provided.

23 Claims, 2 Drawing Sheets

PHOTOPOLYMERIZATION PROCESS AND COMPOSITION EMPLOYING A CHARGE TRANSFER COMPLEX AND CATIONIC PHOTOINITIATOR

CROSS-REFERENCE TO RELATED APPLICATIONS

This application is a nonprovisional of provisional application U.S. Ser. No. 60/094,742 filed on Jul. 31, 1998.

FIELD OF THE INVENTION

The present invention relates to a polymerization process and composition employing ultraviolet(UV) light. More particularly, the polymerization process and composition of the present invention includes at least one unsaturated compound containing a charge transfer complex and a cationic photoinitiator.

BACKGROUND OF THE INVENTION

Commercialization of radiation polymerizable coatings, inks and films requires the reactants be cured quickly and completely.

Typically, such photopolymerizable compositions contain a photosensitive monomeric and/or polymeric material along with a photoinitiator and adjuvant materials which provide desired properties for the end product coating or film.

If the cure of the reactants is not complete, the residues of unreacted starting materials migrate out of the coating following cure. This is disadvantageous since such residues cause contamination of the environment or otherwise render the coating unsuitable for use in connection with products having direct food contact. As a result, efforts have been made to develop UV curable coating compositions that cure as quickly and completely as possible.

It has been found that photopolymerization of a charge transfer complex composition may be achieved with ultraviolet light and without the need for addition of a photoinitiating compound. More particularly, U.S. Pat. No. 5,446,073 to Jonsson et al. describes charge transfer complexes obtained from at least one unsaturated compound that has an electron donor group and an electron withdrawing group. In a preferred embodiment, the specific electron donating material is a vinyl ether and the electron withdrawing compound is a maleamide. These compositions cure in the absence of a photoinitiator upon subjecting the composition to ultra-violet light having a defined wavelength.

More recently, ultra-violet curing of vinyl ether maleate systems have been developed which incorporate free radical photoinitiators. For example, EP 0 322 808 B1 to Friedlander et al. discloses a film or liquid radiation curable composition comprising an ethylenically unsaturated polyester component and ethylenically unsaturated polyester oligomer component in a nonpolymerized vinyl ether component together with the free radical photoinitiator.

A similar vinyl ether maleate system is disclosed in PCT/NL97/00017 to Jansen whereby the radiation curable binder comprises an unsaturated compound containing at least one maleate and an unsaturated compound comprising at least one vinyl ether together with the free radical photoinitiator.

While the above systems provide a modest increase in cure time for the reactants, each falls far short of the cure rates required for purposes of commercialization. Further, a substantial quantity of unreacted vinyl ether and polyester remain following irradiation notwithstanding the use of a free radical photoinitiator. It has been observed that as much as 20% to 40% of unreacted vinyl ether or unsaturated polyester remains un-crosslinked in the resultant polymeric films.

It is known to employ a cationic catalyst or photoinitiator for copolymerization of vinyl ethers and unset polyesters. A small amount of a Lewis Acid catalyst such as $Sn\ Co_4$ will readily polymerize vinyl monomers such as styrene butadiene, vinyl alkyl ethers or the like. For example, U.S. Pat. No. 4,423,136 to Crivello provides a cationic photoinitiator in connection with ultra-violet cure of unsaturated polyesters including vinyl ethers.

In view of the above, a need has existed in the art for an improved photopolymerization process and composition having increased cure rates and conversion of the reactants with a reduction in the release of volatiles.

OBJECTS AND SUMMARY OF THE INVENTION

It is an object of the present invention to provide a photopolymerization process and composition employing a charge transfer complex wherein the starting materials include at least one mono or polyunsaturated basic compound in the presence of cationic photoinitiator and in an alternative embodiment, in the presence of both a cationic photoinitiator and free radical photoinitiator.

It is another object of the present invention to increase cure times, reduce volatiles and improve polymerization of the starting materials.

A further object of the present invention is to provide a photopolymerization process and composition that will not contribute to contamination of the environment and will provide coatings and plastics that are suitable for use in connection with products having direct contact with food.

Yet a further object of the present invention is to provide cationic cure in the presence of mono or polyunsaturated nitrogen containing compound.

In summary, the present invention relates to a radiation curable coating composition comprising a charge transfer complex, the charge transfer complex comprising at least one electron withdrawing reactant component and at least one electron donating reactant component that is free radically reactive therewith, the electron withdrawing reactant component comprising an unsaturated nitrogen containing compound and the electron donating reactant component comprising an unsaturated compound having at least one vinyl ether group, the electron donating reactant component may be separate from or structurally incorporated within the electron withdrawing reactant component and an effective amount of a cationic photoinitiator, the cationic photoinitiator may be combined with a free radical photoinitiator.

The present invention also relates to a photopolymerization process comprising the steps of providing a radiation curable coating composition comprising a charge transfer complex and effective amount of cationic photoinitiator, the charge transfer complex comprising at least one electron withdrawing reactant component and at least one electron donating reactant component free radically reactive therewith, the electron withdrawing reactant component comprising an unsaturated nitrogen containing compound and the electron donating reactant component comprising an unsaturated compound having at least one vinyl ether group, the electron donating reactant component at least one of separate from or structurally incorporated within the at least one electron withdrawing reactant component, applying the radiation curable coating composition to a substrate to be coating and, subjecting the applied radiation curable coating composition to ultraviolet light for a period of time sufficient to polymerize the charge transfer complex.

These and other objects of the present invention will be apparent from the following detailed description and examples of the invention which follow.

DETAILED DESCRIPTION OF THE PREFERRED EMBODIMENT

Figure 1:
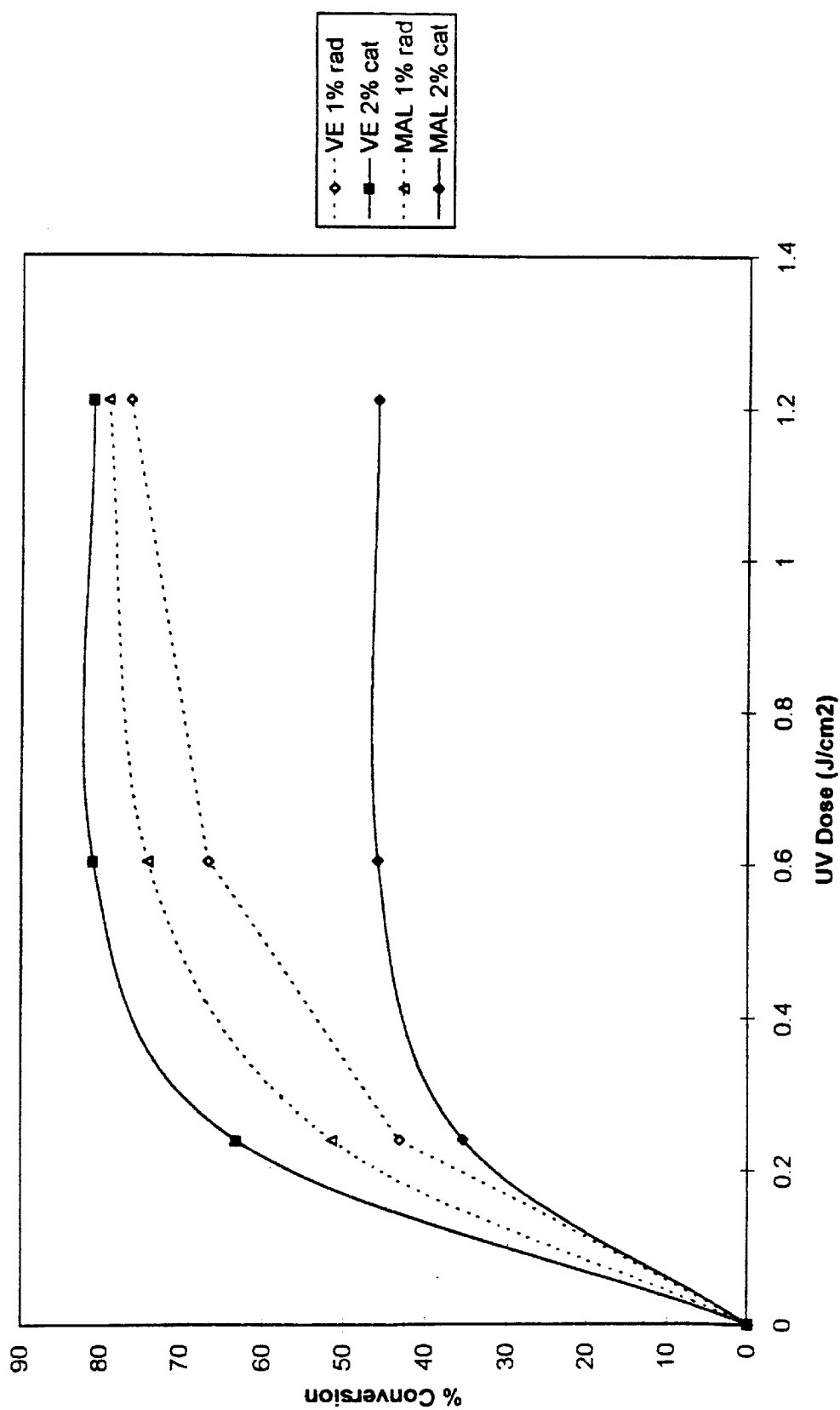
FIG. 1 illustrates conversion rates for vinyl ether and maleiates when employing a cationic catalyst in the absence of a free radical photoinitiator.

Charge transfer complex according to the present invention generally refers to the combination of a monounsaturated compound which includes an electron accepting (withdrawing) group i.e. having electron depleted double bonds, with compounds having an electron donor properties i.e. having electron enriched double bonds. A charge transfer complex is thereby formed by combining each of the above-identified monounsaturated compounds or, in the alternative, may be formed from a single bi-functional compound which includes both the donor and the acceptor groups.

When the charge transfer complex compounds or compound is subsequently exposed to ultra-violet radiation it will polymerize and cure in the presence of a photoinitiator. Charge transfer complex compounds are taught in assignee's prior U.S. Pat. No. 5,446,073 the relevant portions of which are incorporated herein by reference.

It is within the scope of the present invention to provide multiple unsaturated compounds, each of which contain an electron donor group and an electron withdrawing group or, as noted above, one unsaturated compound containing both the electron donor and the electron withdrawing groups. A composition of the present invention is typically liquid and capable of being cured by application of actinic light and in particular ultra-violet light.

In a preferred embodiment of the present invention, the reactants of the charge transfer complex comprises: an unsaturated compound comprising at least one maleate, fumarate, itaconate, citraconate, mesaconate group, and an unsaturated compound comprising at least one vinyl ether group which may be separate from or structurally incorporated within the first unsaturated component.

In a preferred embodiment, the unsaturated compound comprising at least one maleate, fumarate, itaconate, citraconate or mesaconate group is an unsaturated polyester resin. The unsaturated (ethylenically unsaturated) polyester resin can be an unsaturated polyester polymer, an unsaturated polyester oligomer or a mixture thereof. As used herein, the term "unsaturated polyester" is meant to be distinguished from unsaturated alkyd resins and the like.

Unsaturated polyesters of the present invention are esterification products of ethylenically unsaturated carboxylic acids and organic polyhydric alcohols. An unsaturated carboxylic acid having an acid functionality of at least two, more particularly a dicarboxylic acid or its anhydride, is utilized as a starting reactant. The unsaturated polyester resins according to the present invention is prepared by heating the carboxyilic component, an organic polyol component together for about 1 to 10 hours to temperature from about 165° C. to about 250° C. with water formed during the esterification being distilled off using a sparge of an inert gas such as nitrogen. Examples of unsaturated dicarboxylic acids and anhydrides forming unsaturated compounds according to the present invention are maleic acid, maleic anhydride, fumaric acid, itaconic acid, citraconic acid, mesaconic acid.

Specific examples of unsaturated compounds having an electron accepting group include N-alkyl maleimides, mono-and di-cyanofumarates, maleic acid anhydride, fumaronitril, fumaric and maleic mono and diamide derivatives. In particular, these compounds include N-phenyl-maleimide, N-2-ethylhexylmaleimide, N-cyclohexyl-maleimide, fumaronitril, fumaramide, dicyanofumarate diethylester, the di-butylester of monocyano fumarate, maleic acid anhydride, the di-butylamide of fumaric acid and maleic acid di(ethylamide). These compounds may be attached to or incorporated within an oligomer or a polymer such as the polyester component noted earlier polyacrylates, polyethers, polyurethanes and polyolefins.

In a preferred embodiment the monounsaturated compound is a polymer or oligomer comprising at least one maleate, fumarate, itaconate, citraconate or mesaconate group.

The unsaturated polyester according to the present invention is an ordinary unsaturated polyester having a molecular weight between about 800 to about 5,000. These polyesters are based upon one or more diacids and one or more diols, the diacids are at least in part ethylenically unsaturated diacids. As noted above, suitable diacids include maleic acid (anhydride), fumaric acid, itaconic acid (anhydride), citraconic acid (anhydride), mesaconic acid, phthalic acid (anhydride), adipic acid, terephthalic acid, isophthalic acid, malonic acid, succinic acid, glutaric acid, sebacic acid, and 1,4-cyclohexane dicarboxylic acid and Diels Alder products thereof.

Representative diols include, for example, ethyleneglycol, butanediol, neopentylglycol, hexanediol, 1,4-cyclohexane diol, 1,4-cyclohexanedimethanol, propyleneglycol, diethylene glycol, alkoxylated bisphenol-A, and alkoxylated hydrogenated bisphenol-A.

The diacids and diols may be combined with mono-, tri- or tetra-functional alcohols or acids. Suitable compounds include ethylenol, butenol, 2-ethylhexanol, saturated and unsaturated fatty acids, trimellitic acid, trimetholypropane glycerol pentaerythritol and the like.

Separately or in combination with the unsaturated polyesters, the unsaturated compound having the electron accepting group may be an oligomer or a monomer. In the preferred embodiment, a maleate of fumarate end-capped oligomer is used with one or more unsaturated groups. In addition, monomeric species such as, for example, dioctyl-malate can be used or various other maleate or fumarate functional compounds. Thus, the type of unsaturated compound in general will have a molecular weight higher than about 140, preferably higher than 200 and will have a molecular weight lower than about 5,000 and preferably lower than 3,000 depending upon the commercial application.

The unsaturated compound having the electron donor property according to the present invention is a compound having a vinyl ether component or group and includes polymers, oligomers or monomers, the polymer, oligomer or monomer having between about 1 to about 10 vinyl ether groups.

The molecular weight of the vinyl ether compound is in general higher than about 90 and preferably higher than about 100. Generally speaking, the molecular weight is lower than about 5,000 and preferably lower than about 3,000.

The vinyl ether groups of the unsaturated compound containing the at least one vinyl ether group is different from and cocurable with the ethylenically unsaturated moieties in the backbone of the unsaturated compound forming the electron accepting group. By cocurable it is meant the vinyl ether groups are reactive with ethylenic unsaturation derived from the unsaturated polyester following exposure of the composition of the present invention to ultra-violet light. It will be understood that when a composition of the present invention is to be cured utilizing ultra-violet light a photoinitiator and preferably two photoinitiators will be combined with the composition of the present invention either prior to or at the time of UV curing and in the manner as will be further explained below.

Suitable examples of mono- and divinyl ether compounds include butylvinyl ether, cyclohexyldi-methanol-divinyl ether, butyldivinyl ether, triethylene glycol-divinylether and hydroxbutylvinyl ether among others.

Suitable oligomers and polymers are polyurethanes having a polyester, polyether or polycarbonate backbone and a vinylether end group, made by reaction of hydroalkylvinylether, a polyisocyanate and a hydroxy functional oligomer. This oligomer being a polyester, polyether or polycarbonate having a molecular weight between about 200 and 2,000.

As noted earlier, the unsaturated compound containing the electron accepting group may also include the electron donor group. Thus, the unsaturated compound comprising at least one maleiate, fumarate, itaconate, citraconate or mesaconate group and the unsaturated compound comprising at least one vinyl ether group can be combined into a single molecule. For example, a vinyl ether N-polyurethane can be used which has an hydroxyfunctional unsaturated polyester as a backbone. Dual function monomers include the following, a hydroxy functional vinyl ether such as hydroxybutyl vinyl ether can be reacted with an organic diisocyanate such as isophorone diisocyanate in a stoichiometric ratio to provide a half-capped isocyanate adduct. Thereafter, residual isocyano functionality of the half-capped diisocyanate can be reacted with hydroxyl functionality provided by an unsaturated polyester polyol so as to structurally incorporate an average vinyl ether functionality of at least two in the unsaturated polyester component. Examples of unsaturated carboxylic acids and unsaturated carboxylic acid anhydrides as well as organic polyols suitable for preparing hydroxyl-functional unsaturated polyester resins include those described herein previously. Examples of organic diisocyanates include: toluene-2,4-diisocyanate, toluene-2,6-diisocyanate, and mixtures thereof; diphenylmethane-4,4'-diisocyanate, diphenylmethane-2,4'-diisocyanate and mixtures thereof; para-phenylene diisocyanate; biphenyl diisocyanate; 3,3'-dimethyl-4,4'-diphenylene diisocyanate; tetramethylene-1,4-diisocyanate; hexamethylene-1,6-diisocyanate; 2,2,4-trimethylhexane-1,6-diisocyanate; lysine methyl ester diisocyanate; bis(isocyanatoethyl) fumarate; isophorone diisocyanate; ethylene diisocyanate; dodecane-1,12-diisocyanate; cyclobutane-1,3-diisocyanate; cyclohexane-1,3-diisocyanate, cyclohexane-1,4-diisocyanate and mixtures thereof; methylcyclohexyl diisocyanate; hexahydrotoluene-2,4-diisocyanate, hexahydrotoluene-2,6-diisocyanate and mixtures thereof; hexahydrophenylene-1,3-diisocyanate, hexahydrophenylene-1,4-diisocyanate and mixtures thereof; perhydrodiphenylmethane-2,4'-diisocyanate, perhydrodiphenylmethane-4,41-diisocyanate and mixtures thereof. The resulting unsaturated polyester component (also now containing urethane moieties), and having an average vinylether functionality of at least two, usually is free of unreacted NCO groups.

Optionally, a liquid, radiation curable composition of the invention additionally may contain other ethylenically unsaturated monomers or oligomers examples of which include: other vinyl monomers such as vinyl acetate, styrene, vinyl toluene, divinyl benzene, methylvinyl ether, ethylvinyl ether and butylvinyl ether; acrylic and methacrylic esters such as methyl (meth)acrylate, ethyl (meth)acrylate, isopropyl (meth)acrylate, n-butyl (meth)acrylate, isobutyl (meth)acrylate, 2-ethylhexyl (meth) acrylate, 2-hydroxyethyl (meth)acrylate, glycidyl (meth)acrylate, ethylene glycol di(meth)acrylate, diethylene glycol di(meth) acrylate, tetraethylene glycol di(meth)acrylate, glycerol di(meth)acrylate, glycerol tri(meth)acrylate, 1,3-propylene glycol di(meth)acrylate, dipropylene glycol di(meth) acrylate, 1,4-butanediol di(meth)acrylate, 1,2,4-butanetriol tri(meth)acrylate, 1,6-hexanediol di(meth)acrylate, 1,4-cyclohexanediol di(meth)acrylate, 1,4-benzenediol di(meth) acrylate, pentaerythritol tetra(meth)acrylate, 1,5-pentanediol di(meth)acrylate, trimethylolpropane di(meth)acrylate, trimethylolpropane tri(meth)acrylate, 2,2-dimethyl-3-hydroxypropyl-2,2-dimethyl-3-hydroxypropionate, isobornyl (meth)acrylate and tetrahydrofurfuryl (meth) acrylate; (meth)acrylates derived from aromatic glycidyl ethers such as bisphenol-A-diglycidyl ether and aliphatic glycidyl ethers such as butanediol diglycidyl ether, specific examples of which include 1,4-butanediol diglycidylether di(meth)acrylate, bisphenol,-A-diglycidylether di(meth) acrylate and neopentylglycol diglycidylether di(meth) acrylate; and acrylic or methacrylic amides such as (meth) acrylamide, diacetone (meth)acrylamide, N(betahydroxyethyl) (meth)acrylamide, N,N-bis(betahydroxyethyl) (meth)acrylamide, methylene bis(meth) acrylamide, 1,6-hexamethylene bis(meth)acrylamide, diethylenetriamine tris(meth)acrylamide, bis(gamma-(meth) acrylamidepropoxy) ethane and beta-(meth)acrylamide ethylacrylate.

Charge transfer complex compounds within the scope of the present invention further include those taught in International Application No. WO 98/11151 and Application No. WO 98/11152 both applications of which are incorporated herein by reference.

For example, the present invention includes a polymerizable composition, characterized by at least one compound selected among the polymers functionalized by maleimide groups and consisting of products obtained by reaction of at least one maleic anhydride represented by formula: (I):

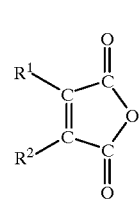

(I)

wherein each of $R^1$ and $R^2$ represents independently H, a $C_1$–$C_{12}$ alkyl group such as methyl, or a halogen such as chlorine; at least one compound (II) having at least one —$NH_2$ function and at least another function selected among —OH, —NH$_2$, —NH—, —COOH and —COOR$^3$, R$^3$ representing a C$_1$–C$_5$ alkyl group; and at least one compound (III) selected among polyols, mono- or polyfunctional epoxy, polyisocyanates and polyamines; the compound (II) having reacted first with the maleic anhydride in order to open maleic anhydride rings, among others, in order to form maleamic acid functions by opening the maleic anhydride rings by the primary amine function of compound (II), the maleamic acid functions having then being at least partially closed again into maleimide rings by heating; the maleimides so produced having reacted with the compound (s) (III) and/or with at least one polyacid and/or one cyclic anhydride (IV), added to the reaction medium after opening of the maleic by anhydride compound (II), and the chain of the polymer having been formed by polycondensation and/or polyaddition reactions having involved the compound(s) (III) and the compound(s) (IV) as added, and/or in case where it would be remained an excess of the maleic anhydride (I) after opening of compound (I) by (II), the excess of maleic anhydride (I), and the uncyclized products being also entered into the composition of the chain; the compounds (III) involved being furthermore selected among: in case where they are intended to react with an anhydride (IV) and/or with the excess of anhydride (I): at least one polyol and/or at least one mono- or polyfunctional epoxy and/or at least one polyamine, and possibly at least one polyisocyanate; in case where they are intended to react with a diacid (IV): at least one polyol and/or at least one mono- or polyfunctional epoxy and/or at least one polyamine, and possibly at least one polyisocyanate; or at least one polyisocyanate; and in case where the compound (II) includes a —COOR$^3$ function: at least one polyol.

Preferably, the anhydride of formula (I) is maleic anhydride.

The compounds (II) are especially selected among the compounds represented by the formulas H$_2$N—A—OH, H$_2$N—A—COOH, H$_2$N—A—COOR$^3$ and H$_2$N—A—NH$_2$, wherein A represents a straight, branched or cyclic alkylene group, or an arylene group, it being possible for the groups to be interrupted by oxygen or sulfur atoms, or by —NR$^4$— groups, wherein R$^4$ represents hydrogen or alkyl. Examples of the compounds (II) include aminoalcohols, such as ethanolamine, propanolamine, isopropanolamine, 2-(2-aminoethoxy)ethanol, N-(2-amino-ethyl)ethanolamine; aminoacids, such as valine, p-amino-benzoic acid, alanine, 2-aminohexanoic acid, 6-aminohexanoic acid, 7-aminoheptanoic acid, 2-aminoisobutyric acid; methyl or ethyl esters of the abovementioned aminoacids; diamines, such as ethylenediamine, 2-methyl-1,5-pentamethylenediamine, hexamethylenediamine, 2,2,4- and/or 2,4,4-trimethylhexamethylenediamine, dodecamethylenediamine, 5-methylnonamethylenediamine, decamethylenediamine, isophoronediamine, bis(4-aminocyclohexyl)methane, bis(3-methyl-4-aminocyclohexyl)methane, bis(3-methyl-4-amino-5-ethylcyclohexyl)methane, 1,2-bis(4-aminocyclohexyl)-ethane, 2,2'-bis(4-aminocyclohexyl)propane, 2,2'-bis(3-methyl-4 -aminocyclohexyl)propane, 4,7-dioxadecane-1,10-diamine, 4,9-dioxadodecane-1,12-diamine, 4,7,10-trioxatridecane-1,13-diamine; and polyoxyethylenated and/or polyoxypropylenated di- or triamines sold under the tradename "Jeffamine®".

Trifunctional compounds (II) such as L-serine, 3-hydroxy 4-amino benzoic acid and 3-amino 4-hydroxy benzoic acid and other triamines such as N-(2-aminoethyl)-1,2-ethanediamine and N-(3-aminopropyl)-1,3-propanediamine, are also included.

The polyols (III) are preferably diols or triols, it is within the scope of the present invention for polyols of higher functionality (pentaerythritol for example) to be present in small amounts. As examples of diols or triols, propylene glycol, dipropylene glycol, diethylene glycol, ethylene glycol, 1,3-butanediol, 1,4-butanediol, neopentyl glycol, triethylene glycol, tripropylene glycol, butylene glycol, glycerol, trimethylol propane, 1,6-hexanediol, 1,4-cyclohexane diol, 1,4-cyclohexane dimethanol, 2-methyl-1, 3-propane diol, 2-butyl-2-ethyl-1,3-propane diol, 1,2-bis (hydroxyethyl)cyclohexane, 4'-(2-hydroxyethoxy)-2,2-dimethyl-2-hydroxyacetophenone, 2,2-dimethyl-3-hydroxypropyl-2,2-dimethyl-3-hydroxypropionate, dibromoneopentylglycol can be mentioned. Monoalcohols may be added in small amounts.

The epoxy compounds (III) are generally mono- and diepoxy compounds, among which epichlorhydrine, 7-oxabicyclo[4.1.0]heptane, 3,4-epoxycyclohexylmethyl 3,4-epoxycyclohexane carboxylate, bisphenol A diglycidyl ether, 1,2-epoxyhexadecane, 3,3,3-trichloropropylene oxide and allyl glycidyl ether.

The polyisocyanates (III) are, above all, diisocyanates, such as 4,4'-diphenylmethane diisocyanate, trimethylhexamethylene diisocyanate, toluene diisocyanate, isophoronediisocyanate, tetramethylene diisocyanate, pentamethylene diisocyanate, 4,4'-dicyclohexylmethane diisocyanate, 2,2,4-trimethylhexamethylene-1,6-diisocyanate, triphenylmethane-4,4',4''-triisocyanate, polymethylene polyphenylisocyanate, m-phenylene diisocyanate, p-phenylene diisocyanate, 1,5-naphthalene diisocyanate, naphthalene-1,4-diisocyanate, diphenylene-4, 4'-diisocyanate, 3,3'-bi-tolylene-4,4'-diisocyanate, 1,4-cyclohexylene dimethylene diisocyanate, xylylene-1,4-diisocyanate, xylylene-1,3-diisocyanate, cyclohexyl-1,4-diisocyanate and 3,3'-dimethyldiphenylmethane-4,4'-diisocyanate.

Preferably, the polyamines (III) are diamines, such as ethylene diamine, 2-methyl-1,5-pentamethylene diamine, trimethylhexane-1,6-diamine, hexamethylenediamine, 2,2, 4- and/or 2,4,4,-trimethylhexamethylenediamine, dodecamethylenediamine, trimethylhexamethlenediamine, 5-methylnonamethylenediamine, decamethylenediamine, isophoronediamine, bis(4-aminocyclohexyl)methane, bis(3-methyl-4-aminocyclohexyl)methane, bis(3-methyl-4-amino-5-ethylcyclohexyl)methane, 1,2-bis(4-aminocyclohexyl)ethane, 2,2'-bis(4-aminocyclohexyl)propane and 2,2'-bis(3-methyl-4-aminocyclohexyl)propane.

As primary examples of polyacids (IV) and as noted earlier, diacids, such as maleic, fumaric, chloromaleic, citraconic, metaconic, itaconic, tetraconic, orthophthalic, isophthalic, terephthalic, succinic, methylsuccinic, adipic, sebacic, tetrabromophthalic, tetrachlorophthalic, glutaric, pimelic acids or the like, are within the scope of the present invention.

The cyclic anhydrides (IV) employed, which are unsaturated or saturated, may be selected among maleic anhydride, succinic anhydride, phthalic anhydride, trimellitic anhydride, tetrahydrophthalic anhydride, hexahydrophthalic anhydride, chlorinated anhydrides such as chlorendic anhydride, tetrachlorophthalic anhydride and tetrabromophtalic anhydride, methyltetrahydrophthalic anhydride, nadic anhydride, methyl nadic anhydride, itaconic anhydride, citraconic anhydride, and glutaric anhydride. Maleic anhydride and succinic anhydride are particularly mentioned. An anhydride including a photoinitiator moiety, such as 3,3',4,4'-benzophenonetetracarboxylic anhydride, may be used in some applications. The polymerizable composition characterized by at least one compound selected among the polymers functionalized by maleimide groups have a number average molecular weight between about 350 and about 5000, and especially between about 500 and about 3000 (as measured by GPC, polystyrene standard). Furthermore, they include generally about 0.02 to about 5 maleimide functions, especially 0.2 to 2 maleimide functions, by kg of polymer (mass).

Preparation of the polymers functionalized by maleimide groups according to the present invention can be carried out generally as follows. At least one compound (I), at least one compound (II) and at least one compound (III), the compounds (I), (II) and (III), are reacted under conditions that permit compound (II) to react first with the maleic anhydride (I), thereby opening the maleic anhydride rings, among others, in order to form maleamic acid functions by opening the maleic anhydride rings by the primary amine function of the compound (II), then to close again at least partially the maleamic acid functions into maleimide rings, by heating, the maleimides so formed reacting with the compound(s) (III) and/or with (IV) at least one polyacid and/or one cyclic anhydride which are added to the reaction medium after opening of (I) by (II), and the chain of the polymer thereby being formed by polycondensation and/or polyaddition reactions involving the compound(s) (III) and said compound(s) (IV) as added and/or, in case where it would remain an excess of maleic anhydride after opening of (I) by (II), the excess of maleic anhydride (I) and with the uncyclized products also entering into the composition of the chain.

According to this process, in a first step, at least one maleic anhydride (I) is reacted with at least one compound (II) in a polar solvent medium in order to open the anhydride rings. In the second step, a ring forming reaction is conducted by heating the reaction medium obtained at the end of the first step, possibly in the presence of at least one cyclic anhydride (IV), wherein the ring forming reaction results in at least partly closing the anhydride rings which were opened in the previous step, in order to give a product of at least partly ring forming reaction which comprises maleimides N-substituted by groups functionalized by —OH or —COOH or —COOR$^3$ or —NH$_2$ or —NH— according to the compound (s) (II) used, in case where the ring forming reaction has been conducted in the absence of any cyclic anhydride (IV), or maleimides N-substituted by groups functionalized by —COOH or —COOR$^3$ with formation of the diacid corresponding to said cyclic anhydride (IV), possibly in mixture with the excess of anhydride (IV) not reacted, in case where the ring forming reaction has been conducted in the presence of cyclic anhydride (IV); and in a third step, the product of the at least partly ring forming reaction is entered into a polycondensation and/or polyaddition reaction with the at least one compound (III) as earlier defined above.

At the first step, the maleic anhydride rings are opened by at least a part of —NH2,—NH— or OH functions of compound(s) (II), the opening by —NH$_2$ functions leading to maleamic acid functions:

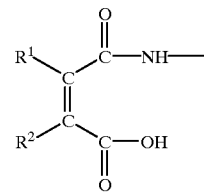

Dependant upon the type of compound (II) selected, the opening of one or more maleic anhydride rings by compound (II) is obtained. The COOH or COOR$^3$ functions of compound(II), if present, remain free.

This first step may be conducted at a temperature of about 0 to 80° C., and particularly 0 to 20° C., during 1 to 10 hours, and especially during 1 to 3 hours, within a polar solvent such as acetone, ethanol, chloroform, dichloromethane, tetrahydrofuran, cyclohexanone, dioxane, methylethylcetone, ethyl acetate among others.

The stoechiometry for this reaction is not essential to the present invention. However, a stoechimetry corresponding to a molar ratio (I)/(II) higher than or equal to 1, may be preferred. It is also possible to proceed with a stoechimetry corresponding to a maleic anhydride function for each NH$_2$, OH or NH function of compounds (II). When the maleic anhydride (I) is introduced in excess, the maleic anhydride unconsumed at this step is then fed at the third step. In that situation, if no cyclic anhydride (IV) is added at the second step, the second step is conducted by continuing the heating and the third step by further continuing the heating and, following evaporation of the solvent, addition of compound (III), for example a polyol. However, according to a further variant of the invention, the latter could be added at the beginning.

Before starting the second step (at least partial cyclization), except if the same solvent is maintained, the polar solvent of the first step is removed in general by evaporation. Otherwise, the solvent may be recycled.

In the case where the second step is conducted in the presence of cyclic anhydride [(IV) and/or an excess of (I)], it is conducted generally at a temperature of about 40 to 160° C., and especially of 80 to 120° C., during 0.5 to 10 hours, especially during 1 to 6 hours, in an aprotic solvent such as toluene and xylene. This can also be conducted in the absence of any solvent; the excess of anhydride could be considered as acting as a solvent.

In the case where the second step is conducted in the absence of anhydride, it is conducted generally at a temperature of 40 to 160° C., especially of 80 to 110° C., during 0.5 to 10 hours, especially during 3 to 7 hours, in a solvent of the same acid as obtained in the first step. Ethanol and methanol are representatives examples.

The solvent which would be used in this step is then generally evaporated and or recycled.

The polycondensation and/or polyaddition reactions of this third step are conventional reactions and known to those of ordinary skill in the art.

In the case of a reaction with at least one polyol and/or one epoxy and/or one polyamine, and possibly with (IV) at least one polyacid or one anhydride, this third step can conducted at a temperature of 150 to 250° C.

The beginning of the reaction is generally conducted at the atmospheric pressure, the end being possibly conducted under reduced pressure.

In the case of a reaction with a polyioscyanate, and, possibly, with at least one polyacid and/or one anhydride and/or one polyol and/or one epoxy and/or one polyamine, the third step may be conducted at a temperature of 20 to 200° C.

In case where the second step is conducted in the presence of anhydride [(IV) or excess of (I)], it is possible to add at the third step a polyisocyanate and a polyol or epoxy and/or a polyamine, with possibly a polyacid (IV); in case where the second step is conducted in the absence of anhydride, it is possible at the third step to add either a polyisocyanate alone, either a polyisocyanate and a polyol and/or a polyamine and/or a polyacid.

If there are esterification reactions (acid +alcohol) or amidification reactions (acid +amine) and addition reaction, the esterification and/or amidification reactions are carried out first between 150 and 250° C., then the addition reactions are carried out (isocyanate+alcohol or acid or amine), at temperatures lower than 150° C.

Otherwise, in a preliminary step, the double bond

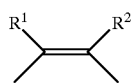

of the anhydride (I) may be protected by a reaction with a protecting agent such as furan or cyclopentadiene, the deprotection being carried out at a time from the second step under the action of heat.

Consequently, this process as set forth above may be a "one pot" process, that does not require isolation of the reaction products after each step, the only measure to be taken after the first and second steps being the evaporation of the solvent.

According to a second embodiment of the process according to the present invention, which is also a "one-pot" process and advantageously without any solvent, the at least one compound (I), at least one compound (II) and at least one polyol and/or epoxy and/or polyamine (III), and possibly at least one polyacid and/or one cyclic anhydride (IV) are reacted by heating a mixture of these compounds at a temperature of 180 to 200° C., with removing the possible condensation water, the compound (I) being introduced preferably in a stoechimetric excess with respect to compound (II), the compound(s) (III) and the polyacid(s) and/or anhydride(s) (IV) being introduced simultaneously with the compounds (I) and (II) or at a later stage. The mixture can be heated to the above mentioned temperature either directly or stepwise.

If a polyisocyanate is used in a "one-pot" process without any solvent, according to another embodiment of this invention, a polyacid (IV) and a polyisocyanate (III) are added to the mixture of compounds (I) and (II) without any solvent, possibly after compounds (I) and (II) have been reacted and the reaction is conducted at a temperature of 40 to 160° C., the compound (I) being introduced preferably in a stoechiometric excess with respect to compound (II).

And according to yet another variant of this invention, to a mixture of compounds (I) and (II) without any solvent, is added a polyol and/or an epoxy and/or a polyamine (III), in excess with respect to compound (I) if it remains compound (I) in a free state or with respect to polyacid (IV) which is added in case of need, and the esterification reaction is conducted between 150 and 250° C., then the mixture is heated to a temperature lower than 150° C., a polyisocyanate (III) is added, and the alcohol/isocyanate reaction is conducted at that temperature.

The composition according to the present invention may optionally further comprise at least one compound (A') selected among N-substituted maleimides, represented by the formula:

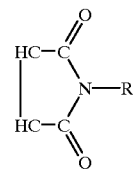

wherein R is an alkyl, arylalkyl, aryl or alkylaryl radical, having especially from 1 to 12 carbon atoms. Examples of these maleimides are N-ethylmaleimide, N-isopropylmaleimide, N-n-butylmaleimide, N-isobutylmaleimide, N-tert.-butylmaleimide, N-n-octylmaleimide, N-cyclohexylmaleimide, N-benzylmaleimide and N-phenylmaleimide.

The at least one compound (B) making part of the composition according to the present invention is advantageously selected among compounds represented by the formula (V):

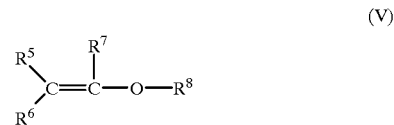

wherein each of $R^5$, $R^6$ and $R^7$ represents independently hydrogen or an aliphatic group, preferably a $C_1$–$C_{12}$ alkyl group, such as methyl, ethyl and propyl; and $R^8$ represents an aliphatic group or an aromatic group, optionally substituted for example by OH compounds represented by the formula (VI):

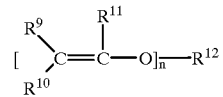

wherein each of $R^9$, $R^{10}$ and $R^{11}$ represents independently hydrogen or an aliphatic group, preferably a $C_1$–$C_{12}$ alkyl group, such as methyl, ethyl and propyl; and $R^{12}$ is a n-valent residue of an organic polyol; n is an integer from 2 to 6; N-vinyl pyrrolidone, N-vinyl imidazole, 2-vinyl pyridine, N-vinylcarbazole, N-vinyl caprolactam, paramethoxystyrene, isoeugenol, 4-propenyl-anisole, monobutyl 4-vinylbutoxy carbonate, monobutyl 4-propenyl butoxycarbonate, N-vinyl-formamide and its derivatives.

As preferred compounds of formula (V), the following monofunctional vinylethers can be mentioned: methyl vinyl ether, ethyl vinyl ether, butyl vinyl ether, isobutyl vinyl ether, octadecyl vinyl ether, 4-hydroxybutyl vinyl ether, dodecyl vinyl ether.

As preferred compounds of formula (VI), the following polyfunctional vinylethers, in particular those obtained in a known manner from a di-, tri- or tetrafunctional organic diol, acetylene and a basic catalyst under high pressure can be mentioned. These include, for example, triethylene glycol divinyl ether, tripropylene glycol divinyl ether, diethylene glycol divinyl ether, 1,4-butanediol divinyl ether, tetraethylene glycol divinyl ether, cyclohexanedimethanol divinylether, bis(4-vinyloxybutyl)succinate, bis(4-vinyloxymethyl-cyclohexylmethyl)glutarate, 1,3-benzenedicarboxylic acid, bis[4-(ethenyloxy)butyl]ester.

The composition according to the invention can also include at least one component selected among a monomer or oligomer reactive diluent, a non reactive solvent or diluent, and an usual additive such as a pigment.

As examples of monomer or oligomer reactive diluent, the following compounds are representative and include vinyl monomers, such as vinyl acetate, styrene, vinyl toluene, divinyl benzene; acrylic and methacrylic esters, such as methyl (meth)acrylate, ethyl (meth)acrylate, isopropyl (meth) acrylate, n-butyl (meth)acrylate, isobutyl (meth) acrylate, 2-ethylhexyl (meth)acrylate, 2-hydroxyethyl (meth)acrylate, glycidyl (meth)acrylate, ethylene glycol di(meth)acrylate, diethylene glycol (di)methacrylate, tetraethylene glycol di(meth)acrylate, glycerol di(meth)acrylate, glycerol tri(meth)acrylate, 1,3-propylene glycol di(meth) acrylate, dipropylene glycol di(meth)acrylate, tripropylene glycol di(meth)acrylate, 1,4-butanediol di(meth)acrylate, 1,2,4-butanetriol tri(meth)acrylate, 1,6-hexanediol di(meth) acrylate, 1,4-cyclohexanediol di(meth)acrylate, 1,4-benzenediol di(meth)acrylate, pentaerythritol tetra(meth) acrylate, 1,5-pentanediol di(meth)acrylate, trimethyolpropane di(meth)acrylate, trimethylolpropane tri (meth)acrylate, 2,2-dimethyl-3-hydroxypropyl-2,2-dimethyl-3-hydroxy-propionate, isobornyl (meth)acrylate and tetrahydrofurfuryl (meth)acrylate; (meth)acrylates derived from aromatic glycidyl ethers such as bisphenol A-diglycidyl ether and derived from aliphatic glycidyl ethers such as butandediol diglycidyl ether, specific examples of them comprising 1,4-butanediol diglycidylether di(meth) acrylate, bisphenol A-diglycidylether di(meth)acrylate and neopentrylglycol diglycidylether di(meth)acrylate; and acrylic or methacrylic amides such as (meth)acrylamide, diacetone (meth)acrylamide, N(beta-hydroxyethyl) (meth) acrylamide, N,N-bis(beta-hydroxyethyl) (meth)acrylamide, methylene bis(meth)acrylamide, 1,6-hexamethylene bis (meth)acrylamide, diethylenetriamine tris(meth)acrylamide, bis(gamma-(meth)acrylamidepropoxy) ethane and beta-(meth) acrylamide ethylacrylate.

As examples of non reactive solvent or diluent, the following compounds can be cited: ethyl acetate, butyl acetate, methoxypropanol, isopropanol, methyl ethyl ketone, acetone.

The charge transfer complex systems as set forth above will further include an effective amount of cationic photoinitiator.

Various types of cationic photoinitiators are suitable. Both ionic cationic photoinitiators such onium salts or organometallic salts are suitable as well as non-ionic cationic photoinitiators such as organosilanes, latent sulphonic acids and the like. Preferred are photosensitive onium salts, in particular, onium salts such as those disclosed in U.S. Pat. Nos. 4,058, 4,138,255, 4,161,478, 4,175,972, all of which are hereby incorporated by reference. Triaryl sulphonium salts are most preferred, in particular triaryl sulphonium salts such as those sold by Union Carbide under the tradename Cyracure UVI 6990 and 6974. Also suitable are ferrocenium salts such as those sold under the Irgacure tradename by Ciba-Geigy, in particular Irgacure 261. Sulphonyloxy ketones and silyl benzyl ethers are also good cationic photoinitiators. A detailed analysis of the mechanism of cationic curing is disclosed in "Photosensitized Epoxides as a Basis for Light-Curable Coatings" by William R. Watt, American Chemical Society Symposium, Ser. 114, Epoxy Resin Chemistry, Chapter 2, 1979, and in "Chemistry and Technology of UV and EB Formulation for Coatings, Inks and Paints", Volume 3, entitled "Photoinitiators for Free Radical and Cationic Polymerization, K. K. Dietliker, pages 332–374 (1991), both of which are hereby incorporated by reference. Photosensitive onium salts are used as photoinitiators in cationic curing, in particular, onium salts such as those disclosed in U.S. Pat. Nos. 4,058,401, 4,138,255, 4,161,478, 4,175,972, all of which are hereby incorporated by reference. Triaryl sulphonium salts are most preferred, in particular sulphonium salts such as those sold by Union Carbide under the tradename Cyracure UVI 6990 and 6974.

In a preferred embodiment of the present invention as set forth above, a second photoinitiator, namely a free radical photoinitiator is added either prior to or during the curing step. Examples of free radical photoinitiators include benzophenoe, anthraquinone, thioxanthone, isobutyl benzoin ether, mixers of butyl isomers of butyl benzone ether, alpha, alpha-diethoxyacetophenone, and alpha, alpha-dimethoxy-alpha-phenylacetothenone. Other examples of free radical photoinitiators according to the present invention include those as set forth in U.S. Pat. No. 4,017,652, the relevant portions of which are incorporated herein by reference.

While the curing times achieved with the use of a single cationic photoinitiator according to the present invention are faster than that shown in the prior art, exceptionally fast curing times can be obtained and a marked increase in conversion of the reactant materials over that known in the prior art may be achieved when the cationic photoinitiator is combined with a free radical photoinitiator. Unexpectedly, the maleiate or the maleimide or other nitrogen (basic) containing groups of the reactant materials do not poison the cationic photoinitiator or catalyst and in fact are caused to be more completely cured and at a faster rate than previously known. Combining the cationic photoinitiator with the free radical photoinitiator greatly increases the conversion rates of all the starting materials and substantially reduces the amount of unreacted starting materials following polymerization. A cationic photoinitiator in combination with a free radical photoinitiator according to the present invention provides the best results for conversion of the reactant products.

In a preferred embodiment, the free radical photoinitiator comprises from about 0.5% by weight to about 1% by weight of the total composition and the cationic photoinitiator comprises from about 1% by weight to about 3% by weight of the total composition.

Pursuant to the present invention the composition is subjected to ultra-violet light to cause polymerization thereof. The ultra-violet light is preferably a high intensity light to provide a dosage of at least 200 millejoules per square centimeter of surface area of the composition being polymerized. In the event that lower energy is to be employed, it is then desired to subject the compositions also to elevated temperatures in order to reduce the time for adequate polymerization to occur.

Suitable lamps employed to provide the desired intensity and availability of wavelength and spectro distribution include that available from Fusion Systems, Corp. of Gaithersburg, Md. under the trade designation F-450 Model with a D bulb. A description of lamps suitable for the present invention need not be described herein in any detail since such can be provided by those skilled in the art without undue experimentation. For example, the lamp disclosed in U.S. Pat. No. 4,042,850 to Ury et al. which is incorporated herein by reference may be used.

Ultra-violet radiation from other suitable sources which emit ultra-violet light having a wavelength between about 180 and 400 nanometers may be employed to cure the composition in the present invention. Additional sources of ultra-violet light are generally known and include for example mercury arcs, carbon arcs, low pressure mercury lamps, medium pressure mercury lamps, high pressure mercury lamps, swirl-flow plasma arcs and ultra-violet light emitting diodes. Preferred are ultra-violet light emitting lamps of the medium pressure mercury vapor type. Such lamps usually have fuse cords envelopes and are ordinarily in the form of long tubes having an electrode at both ends.

If desired, the compositions of the present invention may also contain pigments. The pigment is typically an ultra-violet light transparent pigment meaning the pigment does not substantially interfere with Ultra-violet curing of the composition. Examples of ultra-violet light transparent pigments include talc, calcium carbonate, aluminum silicate, magnesium silicate and barytes.

The radiation curable compositions of the present invention are especially useful as radiation curable coating compositions. They can be applied to a variety of substrates, examples of which include wood, paper, particle board, chip board, metals, metals having primers thereon, glass, plastics and metalized plastics. The radiation curable compositions may be applied by any known means including brushing, dipping, roll coating, spraying, curtain coating and the like. They may be preliminarily dried to remove solvent as desired and then cured by radiation.

The following examples illustrate the present invention and its preferred embodiments without limiting the scope thereof. As used in the body of the specification, examples and claims all percents, ratios and parts are by weight unless otherwise indicated.

In each of the examples, unsaturated polyesters were obtained from commercial sources. The copolymers were prepared from maleic anhydride and glycols such as propylene glycol. The polyesters were blended with vinyl ethers of either butonediol divinyl ether or triethylene glycol divinyl ether. In particular, maleimide unsaturated polyesters were obtained from Cray Valley, France and are of type described in Internation Application Nos. WO 98/11151 and WO 98/11152. The endcapped maleimide unsaturated polyesters were diluted with butanediol divinyl ether or triethyleneglycol divinyl ether.

EXAMPLE 1

A Cray Valley maleimide unsaturated polyester (100 gms) vinyl ether system (UPEMI) was diluted with 0.1% of BYK 333 surfactant. Draw downs were made on steel Q panels employing wire wound draw down rods. Film thickness of 0.5, 1.0 and 2.0 mils were tested and cured at a line speed of 1 pass or 2 passes at 15 ft/min. The coatings were cured using a F-600 microwave lamp equipped with an H bulb.

The photoinitiator-free cured coatings were then evaluated as to Pencil Hardness, Koning Pendulum Hardness, methyl ethyl ketone(MEK) resistance and cotton ball surface tack. The results are set forth in Table I.

TABLE 1

Curing of the Cray Valley UPEMi polyester without photoinitiator

| Film Thickness | Line Speed | Pencil Hardness | | | Pendulum Koning | | | MEK | Surface |
|---|---|---|---|---|---|---|---|---|---|
| | | 1 hr | 24 hrs | 5 days | 1 hr | 24 hrs | 5 days | 1 hr | Tack |
| 0.5 mils | 1 × 15 FPM | HB | H | H | — | — | — | — | OK |
| 0.5 mils | 2 × 15 FPM | HB | H | H | — | — | — | — | OK |
| 1.0 mils | 1 × 15 FPM | F | H | H | — | — | — | — | OK |
| 1.0 mils | 2 × 15 FPM | F | H | H | — | — | — | — | OK |
| 1.0 mils | 1 × 15 FPM | F | H | 2H | 27 | 32 | 52 | +100 | OK |
| 1.0 mils | 2 × 15 FPM | F | H | 2H | 35 | 44 | 86 | +100 | OK |

EXAMPLE 2

The same polymer system as set forth in Example 1 was employed together with a photinitiator comprising a 50–50% mix of Irgacure 1173 and Irgacure 184. The photinitiator mix was added at 1 and 2% to the UPEMi polyester. Pencil hardness, Koning pendulum hardness, MEK resistance and surface hardness data were compiled and are Table 2.

TABLE 2

Curing of UPEMi with Free Radical Photoinitiator

| | Film Thickness | Line Speed | Pencil Hardness | | | Koning Pendulum | | | MEK | Surface |
|---|---|---|---|---|---|---|---|---|---|---|
| | | | 1 hr | 24 hrs | 5 days | 1 hr | 24 hrs | 5 days | 1 hr | Tack |
| 1.0% | 0.5 mils | 60 | H | 2H | 2H | — | — | — | — | OK |
| | 0.5 mils | 90 | H | 2H | 2H | — | — | — | — | OK |
| 1.0% | 1.0 mils | 60 | H | 2H | 2H | — | — | — | — | OK |
| | 1.0 mils | 90 | H | 2H | 2H | — | — | — | — | OK |
| 1.0% | 2.0 mils | 60 | H | 2H | 2H | 44 | 64 | 75 | +100 | OK |
| | 2.0 mils | 90 | H | 2H | 2H | 33 | 49 | 58 | +100 | OK |
| 2.0% | 0.5 mils | 60 | H | 2H | 2H | — | — | — | — | OK |
| | 0.5 mils | 90 | H | 2H | 2H | — | — | — | — | OK |
| 2.0% | 1.0 mils | 60 | H | 2H | 2H | — | — | — | — | OK |
| | 1.0 mils | 90 | H | 2H | 2H | — | — | — | — | OK |

TABLE 2-continued

Curing of UPEMi with Free Radical Photoinitiator

| | Film Thickness | Line Speed | Pencil Hardness | | | Koning Pendulum | | | MEK 1 hr | Surface Tack |
|---|---|---|---|---|---|---|---|---|---|---|
| | | | 1 hr | 24 hrs | 5 days | 1 hr | 24 hrs | 5 days | | |
| 2.0% | 2.0 mils | 60 | H | 2H | 2H | 56 | 77 | 92 | +100 | OK |
| | 2.0 mils | 90 | H | 2H | 2H | 46 | 59 | 80 | +100 | OK |

EXAMPLE 3

The polymer system as set forth in Example 1 was provided and added to the system was a free radical photoinitiator (1:1 blend of 1173 and 184) and a cationic photoinitiator UVI-6974. forth in the above examples to which were added 1%, 2% and 3% by weight of cationic photoinitiator UVI 6974 (triarylsulphoniumhexchloride initiator).

| | MIX I | MIX - II |
|---|---|---|
| UPEMi (stock solution) | 100 | 100 |
| PI mix (1173:184) | .5 | 1.0 |
| UVI-6974 | 1.0 | 2.0 |

| | Mix I | Mix II | Mix III |
|---|---|---|---|
| UPEMi Stock Solution | 99% | 98% | 97% |
| UVI 6974 | 1% | 2% | 3% |

The resultant polymers films were coated on Q panels at thickness of 0.5, 1.0 and 2.0 mils. The films were cured at 60 or 90 FPM line speeds. The results are listed in Table 3.

TABLE 3

Use of Free Radical and Cationic Photoinitiator with the Maleimide Vinyl Ether System

| Film Thickness | Line Speed | Pencil Hardness | | | Koning Pendulum | | | MEK 1 hr | Tack |
|---|---|---|---|---|---|---|---|---|---|
| | | 1 hr | 24 hrs | 5 days | 1 hr | 24 hrs | 5 days | | |
| 0.5 mils | 60 FPM | F | 2H | 2H | — | — | — | — | OK |
| 0.5 mils | 90 FPM | F | 2H | 2H | — | — | — | — | OK |
| 1.0 mils | 60 FPM | F | 2H | 2H | — | — | — | — | OK |
| 1.0 mils | 90 FPM | F | 2H | 2H | — | — | — | — | OK |
| 2.0 mils | 60 FPM | HB | 2H | 2H | 39 | 63 | 72 | +100 | OK |
| 2.0 mils | 90 FPM | HB | 2H | 2H | 33 | 53 | 58 | +100 | OK |
| 0.5 mils | 60 FPM | F | 2H | 2H | — | — | — | — | OK |
| 0.5 mils | 90 FPM | F | 2H | 2H | — | — | — | — | OK |
| 1.0 mils | 60 FPM | F | 2H | 2H | — | — | — | — | OK |
| 1.0 mils | 90 FPM | F | 2H | 2H | — | — | — | — | OK |
| 2.0 mils | 60 FPM | HB | 2H | 2H | 34 | 66 | 75 | +100 | OK |
| 2.0 mils | 90 FPM | HB | 2H | 2H | 37 | 53 | 67 | +100 | OK |

EXAMPLE 4

Three separate formulations were prepared from the stock solution of the UPEMi polymer-vinyl ether mixture as set forth in the above examples to which were added 1%, 2% and 3% by weight of cationic photoinitiator UVI 6974 (triarylsulphoniumhexchloride initiator).

The formulations were coated onto Q steel panels at thickness values of 0.5, 1.0 and 2.0 mils. The films were cured at line speeds of 60 and 90 feet per minute using a F-600-H. The results appear in Table IV.

TABLE 4

Curing of the UPEMi maleimide vinyl ether system with cationic catalyst

| Film Thickness | Line Speed | Pencil Hardness | | | Koning Pendulum | | | MEK | | |
|---|---|---|---|---|---|---|---|---|---|---|
| | | 1 hr | 24 hrs | 5 days | 1 hr | 24 hrs | 5 days | 1 hr | 24 hr | 5 days |
| 0.5 mils | 60 FPM | HB | H | H | — | — | — | 17 | 35 | 65 |
| 0.5 mils | 90 FPM | B | F | H | — | — | — | 17 | 25 | 37 |
| 1.0 mils | 60 FPM | HB | H | H | — | — | — | 47 | +100 | +100 |
| 1.0 mils | 90 FPM | B | F | H | — | — | — | 28 | 60 | +100 |
| 2.0 mils | 60 FPM | HB | H | H | 22 | 35 | 36 | +100 | +100 | +100 |
| 2.0 mils | 90 FPM | B | F | H | 18 | 30 | 31 | +80 | +100 | +100 |
| 0.5 mils | 60 FPM | HB | H | H | — | — | — | 34 | 65 | 77 |

TABLE 4-continued

Curing of the UPEMi maleimide vinyl ether system with cationic catalyst

| Film Thickness | Line Speed | Pencil Hardness | | | Koning Pendulum | | | MEK | | |
|---|---|---|---|---|---|---|---|---|---|---|
| | | 1 hr | 24 hrs | 5 days | 1 hr | 24 hrs | 5 days | 1 hr | 24 hr | 5 days |
| 0.5 mils | 90 FPM | B | F | H | — | — | — | 24 | 50 | 66 |
| 1.0 mils | 60 FPM | HB | H | H | — | — | — | +100 | +100 | +100 |
| 1.0 mils | 90 FPM | B | F | H | — | — | — | +100 | +100 | +100 |
| 2.0 mils | 60 FPM | HB | H | H | 25 | 37 | 42 | +100 | +100 | +100 |
| 2.0 mils | 90 FPM | B | F | H | 22 | 30 | 37 | +100 | +100 | +100 |
| 0.5 mils | 60 FPM | HB | H | H | — | — | — | 55 | 65 | 80 |
| 0.5 mils | 90 FPM | B | F | H | — | — | — | 35 | 50 | 60 |
| 1.0 mils | 60 FPM | HB | H | H | — | — | — | +100 | +100 | +100 |
| 1.0 mils | 90 FPM | HB | F | H | — | — | — | +100 | +100 | +100 |
| 2.0 mils | 60 FPM | HB | H | H | 25 | 33 | 42 | +100 | +100 | +100 |
| 2.0 mils | 90 FPM | B | F | H | 24 | 29 | 39 | +100 | +100 | +100 |

EXAMPLE 5

The UPEMi-vinyl ether polyester system of the above examples was formulated with the free radical catalyst mixture, a cationic photoinitiator UVI-6974, and with a mixture of each of the above catalysts. The system was coated onto a polyethylene film window and FTIR spectra was measured at 1610 cm$^{-1}$ and 775 cm$^{-1}$ for the uncured film. The films were then cured using an arc lamp having a 121 milliwatts power. FTIR was remeasured at the same wavelengths. The % conversion of the DVE-3 vinyl ether and the maleate bonds were measured and appear below in Table 5.

TABLE 5

Using UPEMi-vinyl ether to study double bond conversion by FTIR with free radical and/or cationic catalyst

| | % conversion DVE3 (1610 cm-1) | | | % conversion Maleate (775 cm-1) | | |
|---|---|---|---|---|---|---|
| UV Dose (J/cm$^2$) | 0.24 | 0.605 | 1.21 | 0.24 | 0.605 | 1.21 |
| 1% free radical | 43.1 | 66.65 | 76.4 | 51.15 | 74.1 | 79.2 |
| 1.5% free radical | 40.7 | 65.5 | 70.1 | 54.8 | 75.9 | 81 |
| 1% cationic | 48.2 | 75.85 | 80 | 36.4 | 42.8 | 50.4 |
| 2% cationic | 63.2 | 81 | 81 | 35.4 | 45.9 | 46 |
| 1% rad + 0.5% cat | 32 | 63.1 | 71.95 | 54.5 | 70.3 | 75 |
| 0.5% rad + 1% cat | 36.1 | 83.7 | 85.7 | 41.8 | 61.3 | 67.55 |
| 1% rad + 1% cat | 77.5 | 93.4 | 98.9 | 62.6 | 71.1 | 76.3 |

EXAMPLE 5B

The sample mixes of Example 5 were drawn down on glass panels at 12 microns and cured at 54 meters/min. using a 120 w/cm arc lamp equipped with a H bulb. The results are shown in Table 5B.

Figure 2:
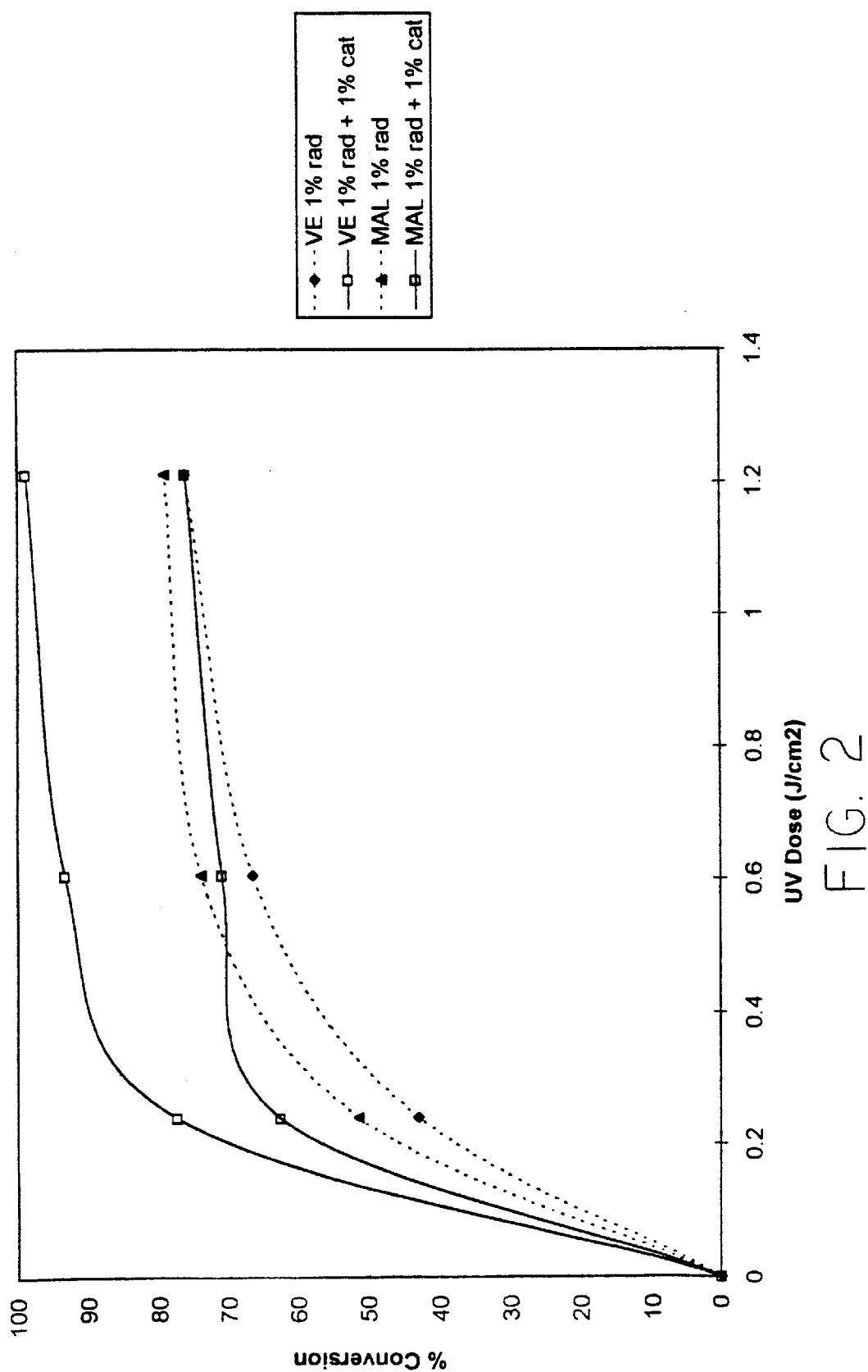
FIG. 2 illustrates the conversion rates for vinyl ether and maleiates when employing a blend of free radical photoinitiator together with a cationic photoinitiator.

FIG. 1 and FIG. 2 illustrate a plot of % conversion verses UV dose for the vinyl ether and maleiate double bonds produced in Examples 5 and 5B and Tables 5-and 5B.

TABLE 5B

Curing of the solutions from Example 5B with an arc lamp

| Photoinitiator | Number of Pass | Pencil Hardness |
|---|---|---|
| 1% free radical | 3 | HB |
| 1% cationic | 8 | <6B |
| 2% cationic | 7 | <6B |
| 1% rad  0.5% cat | 3 | H |
| 0.5% rad  1% cat | 3 | HB |
| 1% rad  1% cat | 2 | H |

While this invention has been described as having preferred design, it is understood that it is capable of further modification, uses and/or adaptations following in general the principle of the invention and including such departures from the present disclosure as come within known or customary practice in the art to which the invention pertains, and as may be applied to the essential features set forth, and fall within the scope of the invention or the limits of the appended claims.

We claim:

1. A radiation curable coating composition comprising:
    a) a charge transfer complex, said charge transfer complex comprising at least one electron withdrawing reactant component and at least one electron donating reactant component free radically reactive therewith, said electron withdrawing reactant component comprising an unsaturated nitrogen containing compound and said electron donating reactant component comprising an unsaturated compound having at least one vinyl ether group, said electron donating reactant component at least one of separate from or structurally incorporated within said at least one electron withdrawing reactant component; and
    b) an effective amount of a cationic photoinitiator.

2. A radiation curable coating composition as in claim 1 and further comprising:
    a) an effective amount of a free radical photoinitiator.

3. A radiation curable coating composition as in claim 1 and wherein:
    a) said cationic photoinitiator comprises from about 1% by weight to about 3% by weight of the total composition.

4. A radiation curable coating composition as in claim 2 and wherein:
    a) said free radical photoinitiator comprises from about 0.5% by weight to about 1.0% by weight of the total composition.

5. A radiation curable coating composition as in claim 1 and wherein:
 a) said cationic photoinitiator is selected from the group consisting of ionic cationic photoinitiators and non-ionic cationic photoinitiators.

6. A radiation curable coating composition as in claim 1 and wherein:
 a) said cationic photoinitiator is selected from the group consisting of onium salts, organometallic salts, organosilanes, latent sulphonic acids, triaryl sulphonium salts, ferrocenium salts, sulphonyloxy ketones and silyl benzyl ethers.

7. A radiation curable coating composition as in claim 2 and wherein:
 a) said free radical photoinitiator is selected from the group consisting of benzophenone, anthraquinone, thioxanthone, isobutyl benzoin ether, alpha-diethoxyacetophenone and alpha-dimethoxy-alpha-phenylacetothenone.

8. A radiation curable coating composition as in claim 1 and wherein:
 a) said unsaturated nitrogen containing compound and said unsaturated compound having at least one vinyl ether group is a compound selected from the group consisting of polyesters, oligomers and monomers.

9. A radiation curable coating composition as in claim 8 and wherein:
 a) said unsaturated nitrogen containing compound ilo having at least one functional group selected from the group consisting of maleate, fumarate, itaconate, citraconate and mesaconate groups.

10. A radiation curable coating composition as in claim 1 and wherein:
 a) said unsaturated nitrogen containing compound is a prepolymer having a maleimid function.

11. A radiation curable coating composition as in claim 1 and wherein:
 a) said unsaturated nitrogen containing compound is a prepolyer having a maleiate function.

12. A radiation curable coating composition as in claim 8 and wherein:
 a) said unsaturated compound having at least one vinyl ether group is a non-polymerized, cocurable vinyl ether component free radically reactive with the unsaturation of said unsaturated polyester component.

13. A radiation curable coating composition as in claim 1 and wherein:
 a) said electron donating reactant component has ethylenic unsaturation and an electron donating group greater than a vinyl ether group.

14. A photopolymerization process comprising the steps of:
 a) providing a radiation curable coating composition comprising a charge transfer complex and effective amount of cationic photoinitiator, the charge transfer complex comprising at least one electron withdrawing reactant component and at least one electron donating reactant component free radically reactive therewith, the electron withdrawing reactant component comprising an unsaturated nitrogen containing compound and the electron donating reactant component comprising an unsaturated compound having at least one vinyl ether group, the electron donating reactant component at least one of separate from or structurally incorporated within the at least one electron withdrawing reactant component;
 b) applying the radiation curable coating composition to a substrate to be coating; and
 c) subjecting the applied radiation curable coating composition to ultraviolet light for a period of time sufficient to polymerize the charge transfer complex.

15. The polymerization process of claim 14 and wherein:
 a) the applied ultraviolet light has a wavelength between about 180 to about 400 nanometers.

16. The polymerization process of claim 14 and wherein:
 a) the dosage of the applied ultraviolet light is at least about 200 millejoules per square centimeter of the applied coating surface area.

17. The polymerization process of claim 14 and wherein:
 a) the coating composition further includes an effective amount of a free radical photoiniator.

18. The polymerization process of claim 14 and wherein:
 a) the cationic photoinitiator comprises from about 1% by weight to about 3% by weight of the total free radical photoinitiator composition.

19. The polymerization process of claim 15 and wherein:
 a) the free radical photoinitiator comprises from about 0.5i by weight to about 1.0% by weight of the total composition.

20. The polymerization process of claim 14 and wherein:
 a) said cationic photoinitiator is selected from the group consisting of ionic cationic photoinitiators and non-ionic cationic photoinitiators.

21. The polymerization process of claim 14 and wherein:
 a) the cationic photoinitiator is selected from the to group consisting of onium salts, organometallic salts, organosilanes, latent sulphonic acids, triaryl sulphonium salts, ferrocenium salts, sulphonyloxy ketones and silyl benzyl ethers.

22. The polymerization process of claim 15 and wherein:
 a) the free radical photoinitiator is selected from the group consisting of benzophenone, anthraquinone, thioxanthone, isobutyl benzoin ether, alpha-diethoxyacetophenone and alpha-dimethoxy-alpha-phenylacetothenone.

23. A radiation curable coating composition comprising:
 a) an unsaturated nitrogen containing polyester component having at least one group attached thereto selected from the group consisting of maleate, fumarate, itaconate, citraconate and mesaconate;
 b) a non-polymerized, co-curable vinyl ether component at least one of separate from said unsaturated polyester component or structurally incorporated in said unsaturated polyester component and free radically reactive therewith;
 c) a cationic photoinitiator; and
 d) a free radical photoinitiator.

* * * * *